(12) United States Patent
Adusumilli et al.

(10) Patent No.: US 10,141,308 B2
(45) Date of Patent: Nov. 27, 2018

(54) LOW RESISTANCE SOURCE/DRAIN CONTACTS FOR COMPLEMENTARY METAL OXIDE SEMICONDUCTOR (CMOS) DEVICES

(71) Applicant: INTERNATIONAL BUSINESS MACHINES CORPORATION, Armonk, NY (US)

(72) Inventors: Praneet Adusumilli, Albany, NY (US); Oleg Gluschenkov, Tannersville, NY (US); Dechao Guo, Niskayuna, NY (US); Zuoguang Liu, Schenectady, NY (US); Rajasekhar Venigalla, Hopewell Junction, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/455,659

(22) Filed: Mar. 10, 2017

(65) Prior Publication Data

US 2018/0261597 A1   Sep. 13, 2018

(51) Int. Cl.
*H01L 29/00* (2006.01)
*H01L 27/092* (2006.01)
*H01L 21/8238* (2006.01)
*H01L 21/02* (2006.01)
*H01L 21/324* (2006.01)

(52) U.S. Cl.
CPC ...... *H01L 27/092* (2013.01); *H01L 21/02667* (2013.01); *H01L 21/324* (2013.01); *H01L 21/823814* (2013.01)

(58) Field of Classification Search
None
See application file for complete search history.

(56) References Cited

U.S. PATENT DOCUMENTS

| 4,420,344 A | 12/1983 | Davies et al. |
| 4,801,555 A | 1/1989 | Holly et al. |
| 6,225,176 B1 | 5/2001 | Yu |

(Continued)

OTHER PUBLICATIONS

Notice of Allowance issued in U.S. Appl. No. 15/804,215 dated Jan. 19, 2018, 8 pages.

(Continued)

*Primary Examiner* — Reema Patel
(74) *Attorney, Agent, or Firm* — Tutunjian & Bitetto, P.C.; Vazken Alexanian

(57) ABSTRACT

A method for fabricating a semiconductor device includes accessing source/drain regions (S/D) in an n-type field effect transistor (NFET) region and in a p-type field effect transistor (PFET) region. First alloy elements are implanted in the S/D regions in the NFET region, and second alloy elements are implanted in the PFET region with the NFET region blocked. The first and second alloy elements form respective amorphized layers on the S/D regions in respective NFET and PFET regions. The amorphized layers are recrystallized to form metastable recrystallized interfaces using an epitaxy process wherein the metastable recrystallized interfaces formed in respective NFET and PFET regions exceed solubility of the first and second alloy elements in respective materials of the S/D regions in the NFET and PFET regions. Contacts to the metastable recrystallized layers of the S/D regions in the NFET and PFET regions are concurrently formed.

16 Claims, 11 Drawing Sheets

(56) References Cited

U.S. PATENT DOCUMENTS

| | | |
|---|---|---|
| 6,472,282 B1 | 10/2002 | Yu |
| 6,506,650 B1 | 1/2003 | Yu |
| 6,521,502 B1 | 2/2003 | Yu |
| 6,630,386 B1 | 10/2003 | Yu |
| 7,045,433 B1 | 5/2006 | Krishnan |
| 7,118,980 B2 | 10/2006 | Jain |
| 7,838,887 B2 | 11/2010 | Woon et al. |
| 9,978,750 B1 | 5/2018 | Adusumilli et al. |
| 2005/0156236 A1 | 7/2005 | Nandakumar et al. |
| 2009/0256160 A1 | 10/2009 | Liu et al. |
| 2011/0171795 A1 | 7/2011 | Tsai et al. |
| 2017/0213739 A1 | 7/2017 | Gluschenkov et al. |

OTHER PUBLICATIONS

U.S. Office Action issued in U.S. Appl. No. 15/914,096 dated Jul. 2, 2018, 7 pages.

US 10,141,308 B2

LOW RESISTANCE SOURCE/DRAIN CONTACTS FOR COMPLEMENTARY METAL OXIDE SEMICONDUCTOR (CMOS) DEVICES

BACKGROUND

Technical Field

The present invention generally relates to low resistance source/drain contacts in complementary metal oxide semiconductor (CMOS) devices, and more particularly to devices and methods for making the same.

Description of the Related Art

In nanometer scale devices, conventional metal liner contact schemes are generally limited by high contact resistivity, especially in n-type field effect transistor (NFET) regions and p-type field effect transistor (PFET) regions. In some conventional contact schemes, for example, contact resistivity for either the NFET or PFET region is above $3\times10^{-9}$ ohm·cm$^2$, and more typically approximately $5\times10^{-9}$ ohm·cm$^2$. Accordingly, high contact resistivity increasingly impacts device performance.

In complementary metal-oxide-semiconductor (CMOS) technology, conventional processes result in one side (e.g., the NFET region or PFET region) of the device having a contact resistivity of approximately $5\times10^{-9}$ ohm·cm$^2$ while the other side has a contact resistivity of approximately $4\times10^{-9}$ ohm·cm$^2$. Source/Drain implantation process can be limited by short channel concerns that impact the transistor gate control and inability of sustaining homogeneity of high concentration of dopants through subsequent high-temperature thermal steps. For example, some implanted light atoms, such as Boron, scatter into the channel region resulting in high Drain-Induced-Barrier-Lowering (DIBL) effect and high off current. Some source/drain implantation processes are also limited by low dopant activation, as certain implanted elements have low solubility in the source/drain semiconducting material. The chemical doping concentration may be high exceeding chemical solubility limits in the source/drain material, but excess implanted dopants are not activated, but rather segregate into stable clusters or precipitates. Further, integration of trench epitaxy (EPI) contacts is complicated and challenging due to separate growth of n-type and p-type epitaxy materials in Middle-Of-Line (MOL) post source/drain and gate formation. In addition, separate patterning of the n/p doped regions for n-type and p-type epitaxy materials in MOL formation can cause yield loss.

SUMMARY

In accordance with an embodiment of the present invention, a method for fabricating a semiconductor device includes accessing source/drain regions (S/D) in an n-type field effect transistor (NFET) region and in a p-type field effect transistor (PFET) region. First alloy elements are implanted in the S/D regions in the NFET region, and second alloy elements are implanted in the PFET region with the NFET region blocked. The first and second alloy elements form respective amorphized layers on the S/D regions in respective NFET and PFET regions. The amorphized layers are recrystallized to form metastable recrystallized interfaces using an epitaxy process wherein the metastable recrystallized interfaces formed in respective NFET and PFET regions exceed solubility of the first and second alloy elements in respective materials of the S/D regions in the NFET and PFET regions. Contacts to the metastable recrystallized layers of the S/D regions in the NFET and PFET regions are concurrently formed.

In another embodiment, a method for fabricating a semiconductor device includes accessing source/drain regions (S/D) in an n-type field effect transistor (NFET) region and in a p-type field effect transistor (PFET) region; implanting first alloy elements in the S/D regions in the NFET region to form amorphized layers on the S/D regions in the NFET region; recrystallizing the amorphized layer in the NFET region at a first thermal budget to form metastable recrystallized interfaces using a solid phase epitaxy process wherein the metastable recrystallized interfaces formed in the NFET region exceeds solubility of the first alloy elements in a material of the S/D regions in the NFET region; implanting second alloy elements in the PFET region with the NFET region blocked to form an amorphized layer on the S/D regions in the PFET region; recrystallizing the amorphized layer in the PFET region at a second thermal budget lower than the first thermal budget to form metastable recrystallized interfaces using a liquid phase epitaxy process wherein the metastable recrystallized interfaces formed in the PFET region exceeds solubility of the second alloy elements in a material of the S/D regions in the PFET region; and concurrently forming contacts to the metastable recrystallized layers of the S/D regions in the NFET and PFET regions.

A semiconductor device includes source/drain regions (S/D) in an n-type field effect transistor (NFET) region and in a p-type field effect transistor (PFET) region. Contacts are formed to the recrystallized layers of the S/D regions in the NFET and PFET regions. Metastable recrystallized interface layers are formed between the contacts and the S/D regions in respective NFET and PFET regions. The recrystallized interface layers include an alloy element concentration that exceeds solubility with a respective material of the S/D regions in the respective NFET and PFET regions.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The following description will provide details of preferred embodiments with reference to the following figures wherein.

DETAILED DESCRIPTION

Figure 1:
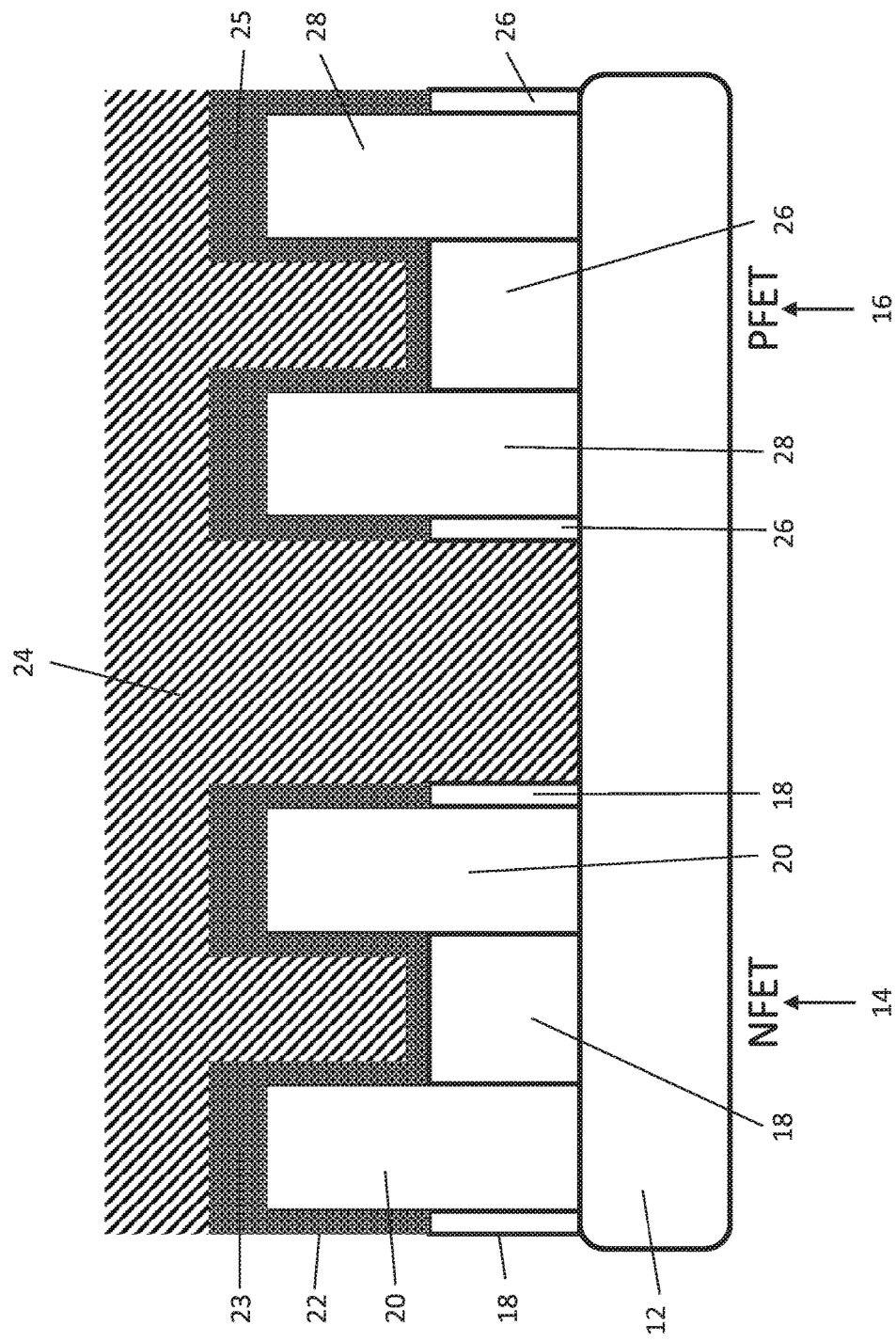
FIG. 1 is a cross-sectional view showing a complementary metal-oxide-semiconductor (CMOS) device having source and drain regions formed and covered by a protection layer and an interlevel dielectric layer (ILD) in accordance with one embodiment of the present invention.

In accordance with the present principles, low resistance source/drain contacts are integrated together on a same substrate in a complementary metal oxide semiconductor (CMOS) device. The embodiments of the present invention provide methods and devices that integrate low resistance source/drain contacts in NFETs and PFETs on a same chip (e.g., CMOS chip) and/or other tight pitch devices. Further, the embodiments of the present invention provide through trench implantation and/or solid phase epitaxy (SPE) or liquid phase epitaxy (LPE) processes to form contact interfaces in both the NFET and PFET regions having low contact resistivities (e.g., approximately $2.5 \times 10^{-9}$ ohm·cm$^2$ or below). In some embodiments, amorphization implantation processes can be followed by solid phase epitaxy (SPE) or liquid phase epitaxy (LPE) processes on source/drain regions without additional gas phase epitaxial growth (EPI) processes in the contact trenches. Accordingly, the methods and devices described herein provide low contact resistivity (e.g., $2.5 \times 10^{-9}$ ohm·cm$^2$ or below) for both NFET and PFET regions, CMOS compatibility, and no short channel impact.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that a particular shape of transistor active region or its channel employed in exemplary embodiments does not limit application of the present invention to that shape. Aspects of the present invention can be employed with different geometrical orientations and shapes of transistor active regions or its channel such as planar, fin-shaped FETs or FinFETs, surround-gate FETs, multiple-gate FETs, nano-wire or nano-sheet FETs, and vertical FETs.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In some embodiments, $Si_xGe_{1-x}$ where $0.7<x<0.4$ (such as $Si_{0.7}Ge_{0.3}$, $Si_{0.5}Ge_{0.5}$, $Si_{0.4}Ge_{0.6}$) can be specifically used for the low contact resistance source/drain formation on p-type transistors. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated device 10 is depicted in accordance with the present principles. The device 10 includes an NFET region 14 and a PFET region 16 laterally separated by an insulating material 24 on a substrate or chip 12 (e.g., a CMOS chip). In some embodiments, the insulating material 24 includes an interlevel dielectric material (ILD) and/or a shallow trench isolation (STI) insulating fill, such as an oxide (e.g., silicon oxide). The substrate 12 can include multiple layers and can include any suitable substrate structure, e.g., a bulk semiconductor, a semiconductor-on-insulator (SOI) substrate, etc. In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

In one embodiment, the device 10 may be processed for complementary metal oxide semiconductor (CMOS) fabrication, which includes p-type devices and n-type devices. The devices may include field effect transistors (FETs). In one embodiment, the NFET region 14 includes an n-type source/drain region 18, an n-compatible gate structure(s) 20, a channel region underneath gate structures (20), and a protection layer that includes spacers 22 and a cap 23. The n-compatible gate(s) 20 can include gate dielectric materials, such as, but not limited to, Hafnium oxide ($HfO_2$), Zirconium dioxide ($ZrO_2$), Silicon dioxide ($SiO_2$), Silicon Oxynitride (SiON), Aluminum Oxide ($Al_2O_3$), etc., and/or one or more metal layers, such as, but not limited to, Titanium nitride (TiN), Titanium-Aluminum-Carbon (TiAlC), Titanium Carbide (TiC), Tungsten (W), Cobalt (Co), Lanthanum (La), etc.

The n-compatible gate structure(s) 20 wraps around the NFET channel region (not shown). The channel region is a lightly doped p-type semiconductor including silicon, however other similarly functioning materials are readily contemplated. The channel region abuts source/drain regions 18 on its two opposite sides (only one side is shown for clarity). The source/drain region 18 is an n-type semiconductor and can include suitable epitaxial grown materials, such as, e.g., silicon phosphorous (SiP), although other suitable materials can be employed.

The protection layer (e.g., spacers 22, and cap 23) is an insulator and can include dielectric materials, such as, e.g., a nitride, silicon nitride (SiN), silicon boron carbon nitride (SiBCN), etc. The n-type semiconductor material of the source/drain regions 18 has a first melting point, $T_{m1}$. If crystalline Si:P material is employed, it has a $T_{m1}$ of about 1400 degree Celsius. The concentration and distribution of n-type dopant (e.g., phosphorus) in region 18 is optimized to provide a lowest series electrical resistance within region 18, e.g., from about $5 \times 10^{20}$ $cm^{-3}$ to about $5 \times 10^{21}$ $cm^{-3}$ or from about 1 atomic % to 10 atomic %. The maximum chemical solubility of phosphorus in silicon is about $1.5 \times 10^{21}$ $cm^{-3}$ or about 3 atomic %. The phosphorus in excess of about $1.5 \times 10^{21}$ $cm^{-3}$ can easily segregate into clusters or precipitates during high-temperature steps employed for forming gate structure 20, 28.

The PFET region 16 includes p-type source/drain regions 26, a p-compatible gate structure(s) 28, a lightly doped n-type channel region underneath gate structures (28) and a protection layer 25 (e.g., spacers 22 and a cap 23). In some embodiments, the p-compatible gate structure(s) 26 include a gate dielectric material, such as, e.g., $HfO_2$, $ZrO_2$, $SiO_2$, SiON, $Al_2O_3$, etc., and/or one or more metal layers, such as TiN, TiC, W, Co, La etc. The p-compatible gate structure(s) 28 wraps around PFET channel region (not shown). The channel region can include a lightly doped n-type semiconductor including, e.g., silicon or silicon germanium; however other similarly functioning materials can be employed. The channel region abuts source/drain regions 26 on its two opposite sides. The p-type source/drain region 26 in the PFET region 16 can include epitaxially grown materials, such as, e.g., silicon germanium (SiGe), although other materials can be employed. In one embodiment, the source/drain region 26 includes SiGe doped with Boron, e.g. SiGe:B. The material of p-type source/drain region 26 of the PFET region can include $Si_{1-x}Ge_x$:B with $0.3<x<0.7$.

Source/drain regions 26 are optimized to give minimum sheet resistance for the electrical current. The p-type semiconductor material of the source/drain regions 26 has a second melting point, $T_{m2}$. The second melting point $T_{m2}$ is lower than the first melting point $T_{m1}$. For example, the crystalline SiGe:B material has $T_{m2}$ in a range of about 1000 degrees Celsius to about 1300 degree Celsius depending on Ge content in SiGe film. The concentration and distribution of p-type dopant (e.g. boron) in region 26 is optimized to provide the lowest series electrical resistance within region 26 and is from about $5\times10^{20}cm^{-3}$ to about $2\times10^{21}$ $cm^{-3}$ or from about 1 atomic % to 4 atomic %. The maximum chemical solubility of boron in silicon germanium is about $5\times10^{20}$ $cm^{-3}$ or about 1 atomic %. SiGe:B material is relatively stable against thermal steps employed in forming gate structures 20, 28 resulting in minimum precipitation of boron when used moderately in excess of its chemical solubility in SiGe. In some embodiments, the protection layer (e.g. spacers 22 and a cap 23) protects the gate structures 20, 28 from subsequent processes and provides an isolation between the gate and the source/drain.

Figure 2:
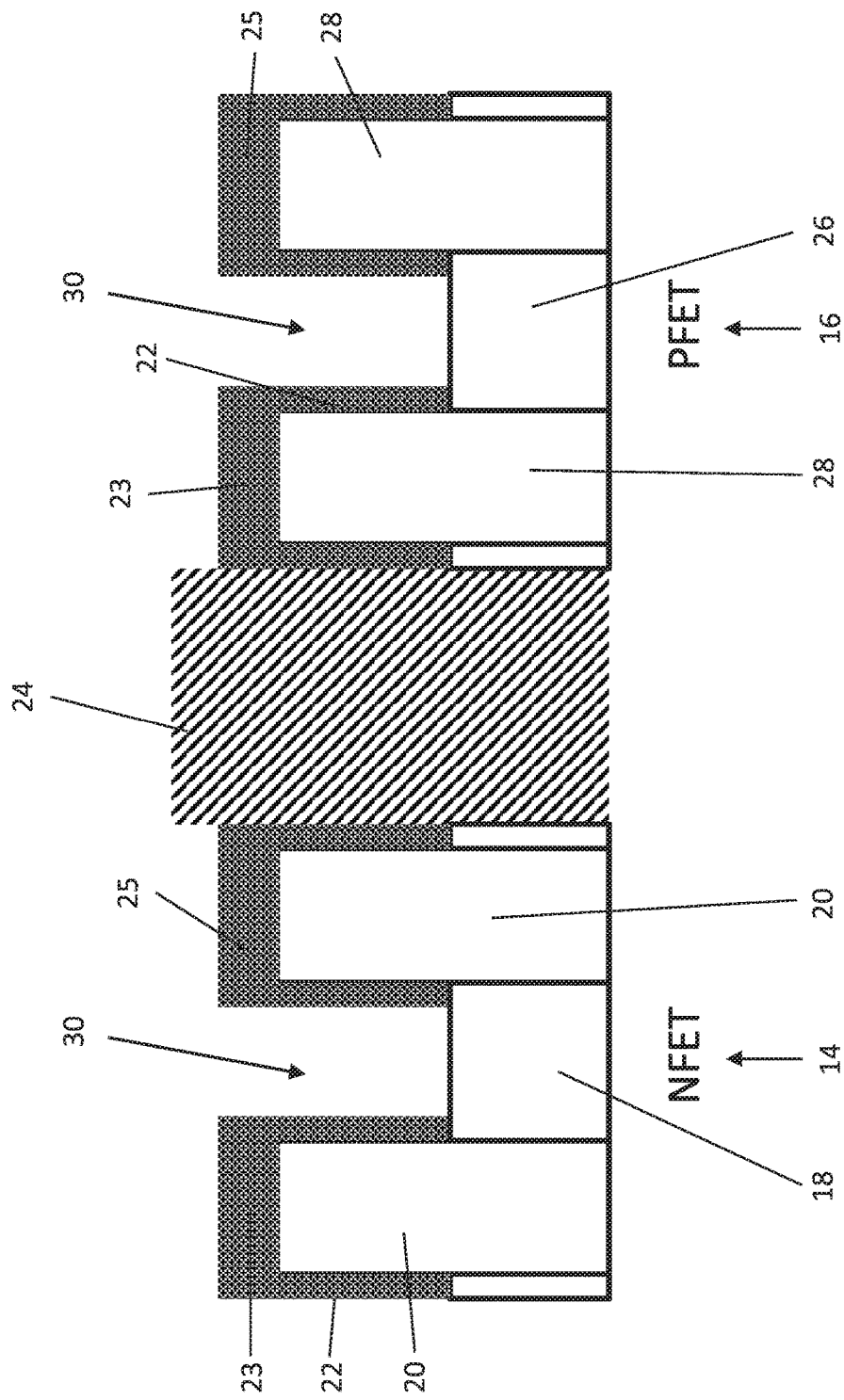
FIG. 2 is a cross-sectional view of the CMOS device of FIG. 1 showing the source and drain regions in both NFET and PFET regions exposed in accordance with one embodiment of the present invention.

Referring to FIG. 2, portions of the insulating material 24 and/or protection layer 25 over the source/drain regions 18 and 26 can be removed to provide a trench 30 over the source/drain regions 18, 26 between adjacent n-type gate structures 20 and/or adjacent p-type gate structures 28. In some embodiments, portions of the insulating material over the NFET region 14 and the PFET region 16, and within the trench 30, are removed using one or more etching processes, such as reactive ion etch (RIE), a dry etch method, etc. Further, a portion of the protection layer 25 on a horizontal surface of the source/drain regions 18, 26 can be removed using a directional RIE, an isotropic diluted HF wet etching, a directional Gas Cluster Ion Beam (GCIB) process and/or other etching processes or combinations thereof.

Figure 3:
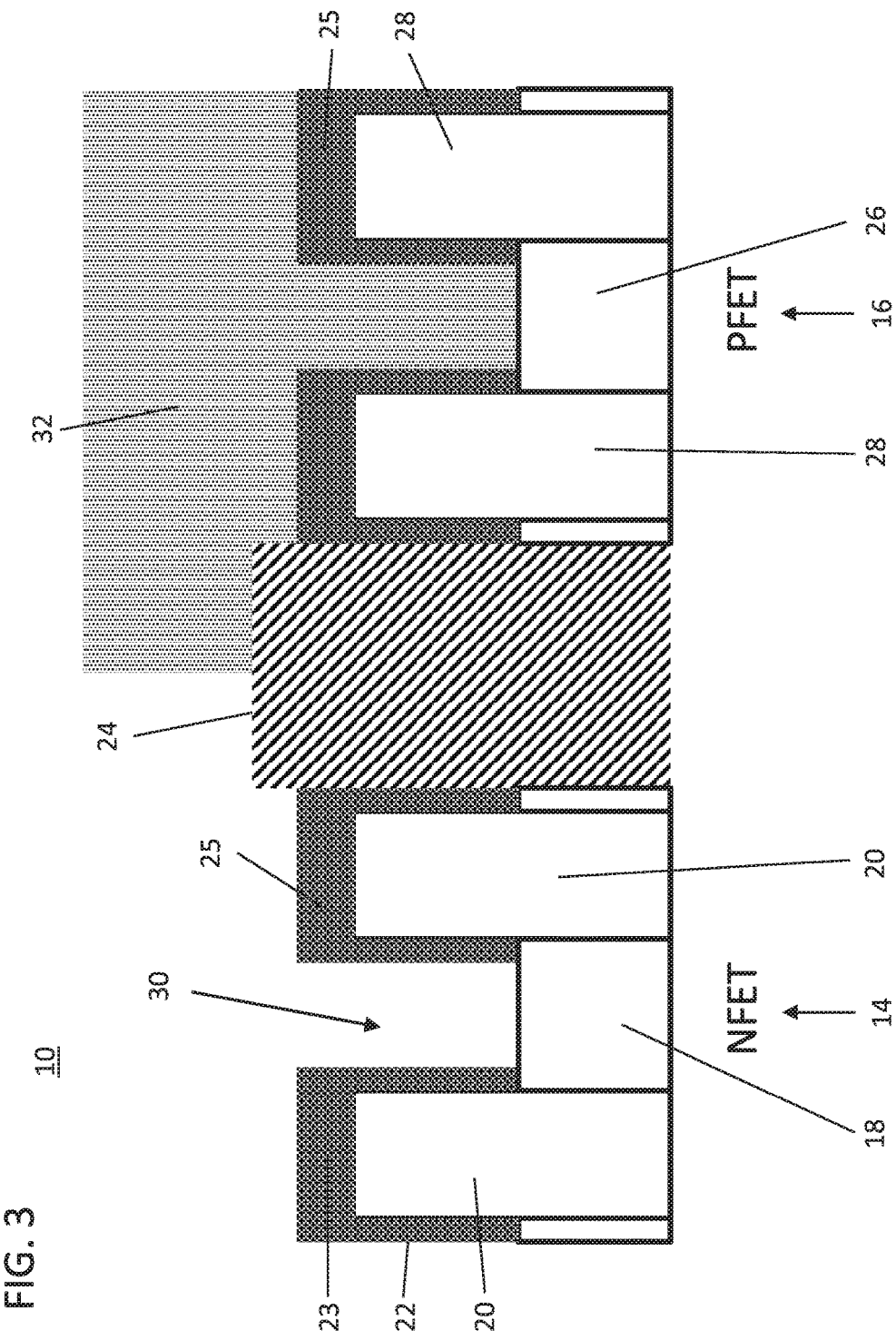
FIG. 3 is a cross-sectional view of the CMOS device of FIG. 2 having the PFET region blocked to process the NFET region in accordance with one embodiment of the present invention.

Referring to FIG. 3, a block level lithography process includes forming a resist or other masking materials 32 over the PFET region 16 and in the trench 30 of the PFET region 16, and patterning the mask 32 to cover a p-type field effect transistor (PFET) region 16 leaving the NFET region 14 exposed.

Figure 4:
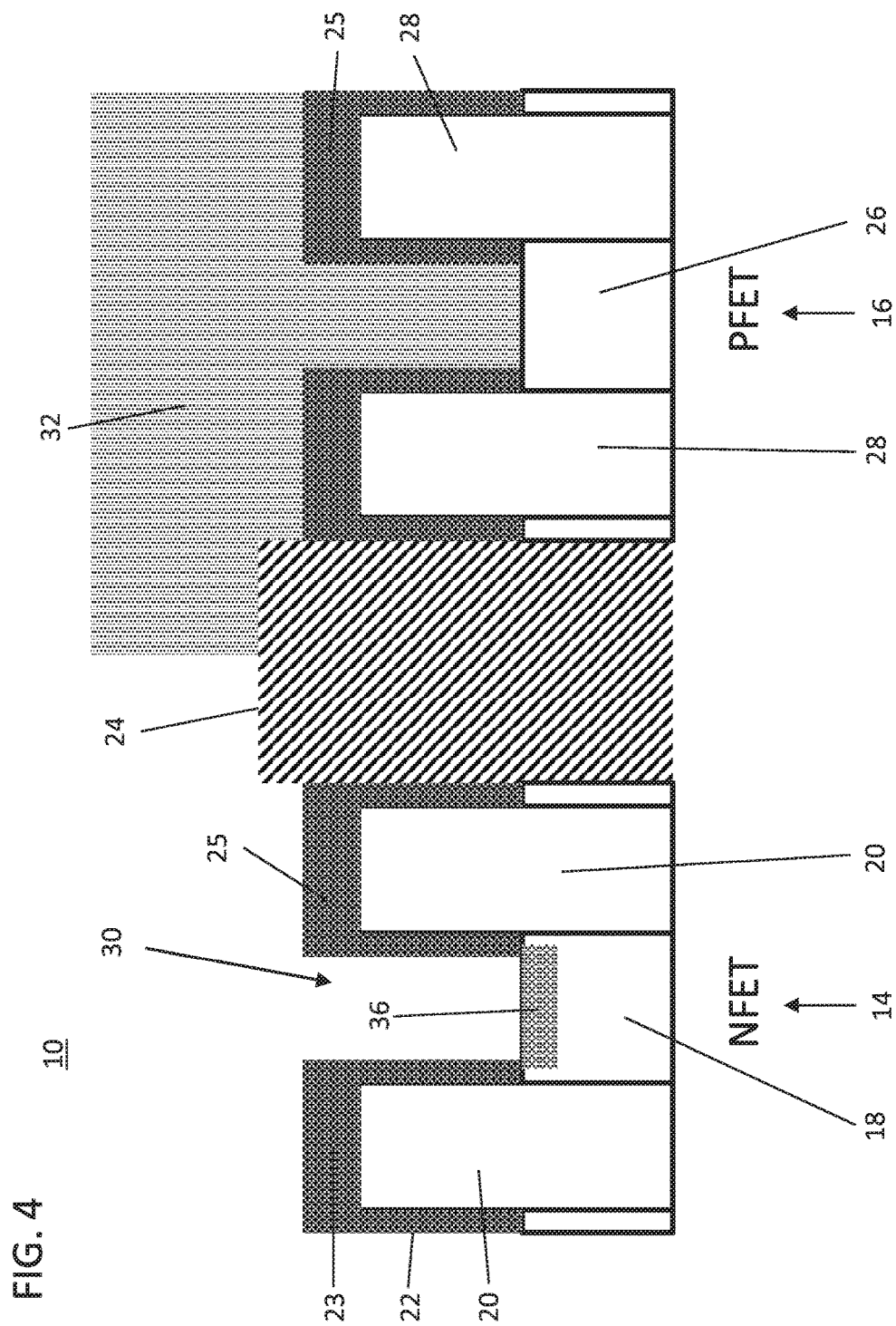
FIG. 4 is a cross-sectional view of the CMOS of FIG. 3 having an amorphous region implanted in source/drain (S/D) regions in the NFET region in accordance with one embodiment of the present invention.

Referring to FIG. 4, the NFET region 14 is then implanted with alloy elements or implant elements, e.g., neutral ion species, to form an amorphous layer 36 in a top portion of the source/drain 18. In some embodiments, the alloy elements include phosphorous (P). The first amorphous layer 36 can include amorphized and homogenous Si:P material with the concentration of phosphorus exceeding its chemical solid solubility in silicon (e.g., exceeding about 3 atomic % or $1.5\times10^{21}$ $cm^{-3}$). The preferred concentration of phosphorus in layer 36 is from about 5 atomic % or $2.5\times10^{21}$ $cm^{-3}$ to about 15 atomic % or $7.5\times10^{21}$ $cm^{-3}$. The dose of phosphorus implant is selected to obtain a desired level of phosphorus in layer 36. The energy of phosphorus implant is selected to yield the desired depth or thickness of layer 36. The preferred depth of layer 36 is from about 5 nm to about 10 nm yielding the preferred implant energy range of from about 0.6 keV to about 3 keV. The preferred dose range is from about $1\times10^{15}$ $cm^{-2}$ to about $5\times10^{15}$ $cm^{-2}$. The implantation process can be conducted at room temperature or below room temperature (e.g., cold or cryogenic ion implantation) in a beamline or plasma doping implant equipment.

If the existing concentration of phosphorus in source/drain regions 18 exceeds 5 atomic % or $2.5\times10^{21}$ $cm^{-3}$, the amorphization implant can be conducted using neutral species such as Si, Ge or Xe. One purpose of amorphizing neutral implantation is to break up bonds within phosphorus precipitates and/or clusters creating a relatively homogeneous Si:P amorphous layer 36. In this case, the block mask 32 is optional or a soft mask can be employed. In some embodiments, the amorphizing implantation is conducted using Ge ions with the energy range of from about 2 keV to about 5 keV, and the dose range of from about $1\times10^{14}$ $cm^{-2}$ to about $5\times10^{14}$ $cm^{-2}$. While Ge ions can break the bonds within phosphorus precipitates and/or clusters, their ability to mix up material to yield a fully homogeneous amorphous Si:P material may be limited. Accordingly, implanting phosphorus ions is preferred since higher degree of homogeneity within amorphous layer 36 is provided due to random placement of implanted, additional phosphorus. Other implant elements or alloy element in the amorphized region 36 can include, for example, Arsenic (As), Antimony (Sb), or blanket implantation of Germanium (Ge), Silicon (Si), Xenon (Xe) as described above. Phosphorus (P) is preferred. The amorphized region 36 provides a base for the rapid recrystallization during a subsequent fast annealing process, thereby forming a metastable homogeneous material (e.g., metastable n-type dopant alloy) within a top portion of the n-type contact area (e.g., a top portion of the source/drain of the NFET).

Figure 5:
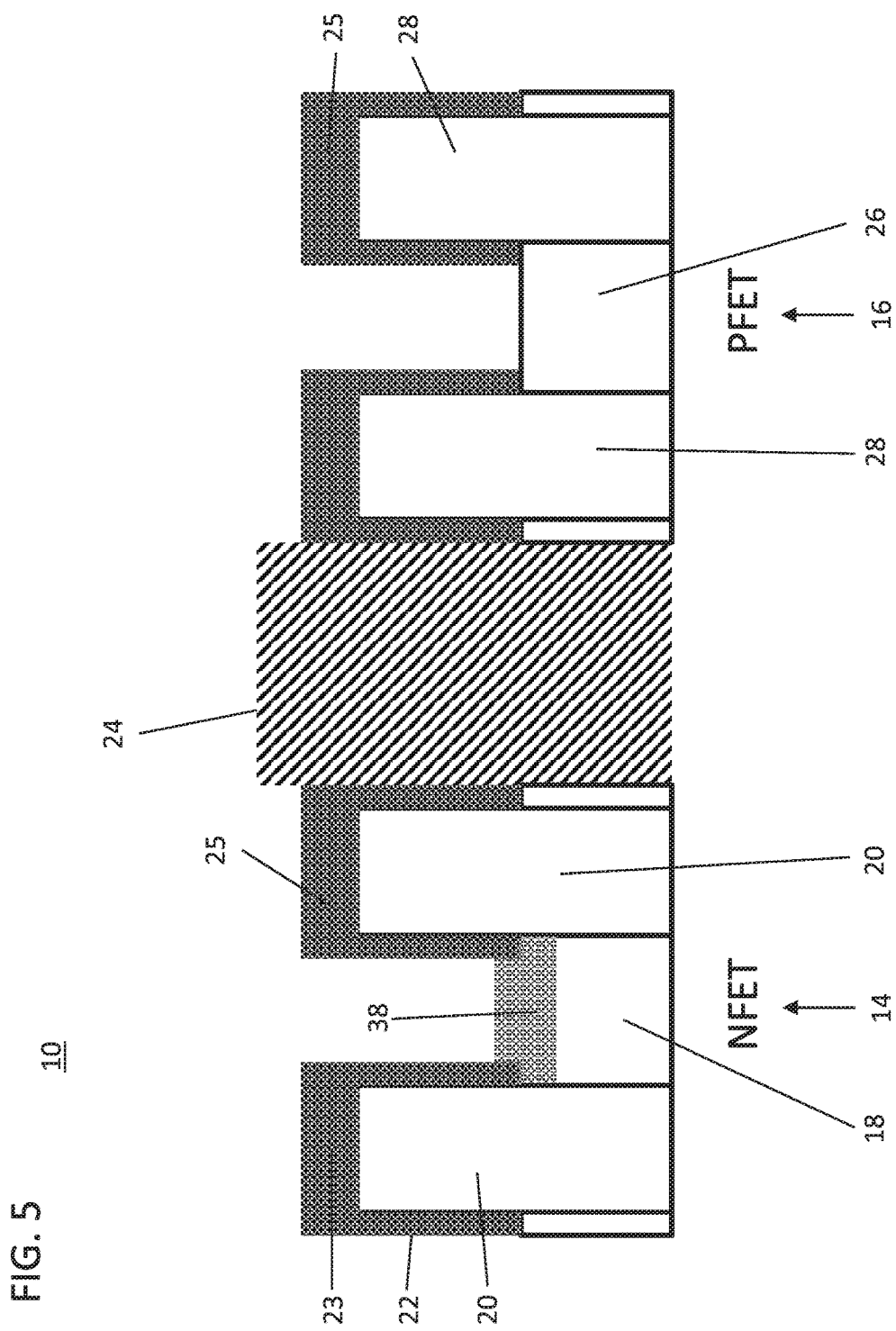
FIG. 5 is a cross-sectional view of the CMOS of FIG. 4 having a recrystallized alloy layer formed in the S/D regions of the NFET region in accordance with one embodiment of the present invention.

Referring to FIG. 5, the block mask 32 is removed and a solid phase epitaxy (SPE) or liquid phase epitaxy (LPE) is induced by a first fast annealing to provide a first metastable crystalline layer 38. The crystalline layer 38 is an alloy layer (e.g., a metastable alloy layer) for the n-type source/drain region 18 which includes a substantially higher homogeneous concentration of material above the respective solid solubility of the implant element in the S/D region 18. For example, the P has a higher concentration (e.g., about 6 at % to about 12 at % P) than the solubility of P in silicon (S/D region 18). The metastable alloy layer 38 in the S/D region 18 provides a lower contact resistance for the NFET contact. The SPE or LPE processes alter the crystallinity of the first amorphous region 36, or portions thereof, and the metastable crystalline layer 38 exhibits crystalline phases (e.g., polycrystalline, nanocrystalline, single crystalline, etc.).

A first fast annealing is performed at a first temperature and a first duration or, collectively, with a first thermal budget. The duration can be measured at the peak or target temperature minus 50 degrees Celsius ($T_p$–50 C.). In the case of SPE, the first fast annealing is a millisecond annealing with characteristic duration at ($T_p$–50 C.) of from about 50 microseconds to about 3 milliseconds. The range of a first annealing temperature suitable for inducing SPE is from about 800 degrees Celsius to about 900 degree Celsius. Millisecond annealing temperatures higher than about 900 degree Celsius are not desirable due to negative effects on the gate structures 20, 28. Shorter millisecond anneals with characteristic durations at ($T_p$–50 C.) of from about 50 microseconds to about 500 microseconds are preferred due to a reduced negative impact on the gate structures 20, 28. For example, a rapid anneal (e.g., a millisecond laser anneal) having a first temperature of approximately 850 degrees Celsius and duration of approximately 200 microseconds at 800 degree Celsius can transition the amorphous phase of the material of the first amorphous layer 36 to provide the recrystallized crystalline layer 38 without impacting gate structures 20, 28.

Alternatively, in the case of LPE, the first fast annealing is a nanosecond laser melt annealing with characteristic duration of from about 20 nanoseconds to about 1000 nanoseconds at the melting point of the amorphous material 36. The melting point of amorphous material 36 is about 200 degrees Celsius lower than the melting point $T_{m1}$ of crystalline material 18. The amorphous Si:P material 36 has melting point at around 1200 degree Celsius. The nanosecond laser melt annealing converts amorphous material 36 directly into its liquid phase that then quickly recrystallizes into a crystalline phase forming crystalline layer 38. The ultra-short duration of nanosecond laser melt annealing reduces negative effects onto the gate structures 20, 28 despite its high temperature, however, it can negatively impact PFET structures such as source/drain regions 26 that have a low melting point $T_{m2}$. This can limit the use of nanosecond laser melt annealing at this step to the cases when $T_{m2}$ is substantially higher than about 1200 degree Celsius. The low-temperature SPE re-growth induced by a short millisecond annealing is preferable at this step.

The metastable alloy of crystalline layer 38 can include, for example, a homogeneous dopant concentration of more than 5 atomic percent in excess of maximum solid solubility of 1.5 atomic percent. In some embodiments, the metastable alloy of crystalline layer 38 includes a homogenous implant element concentration in a range between 6 and 12 atomic percent, which is greater than the solubility limit of the implanted elements in silicon.

Figure 6:
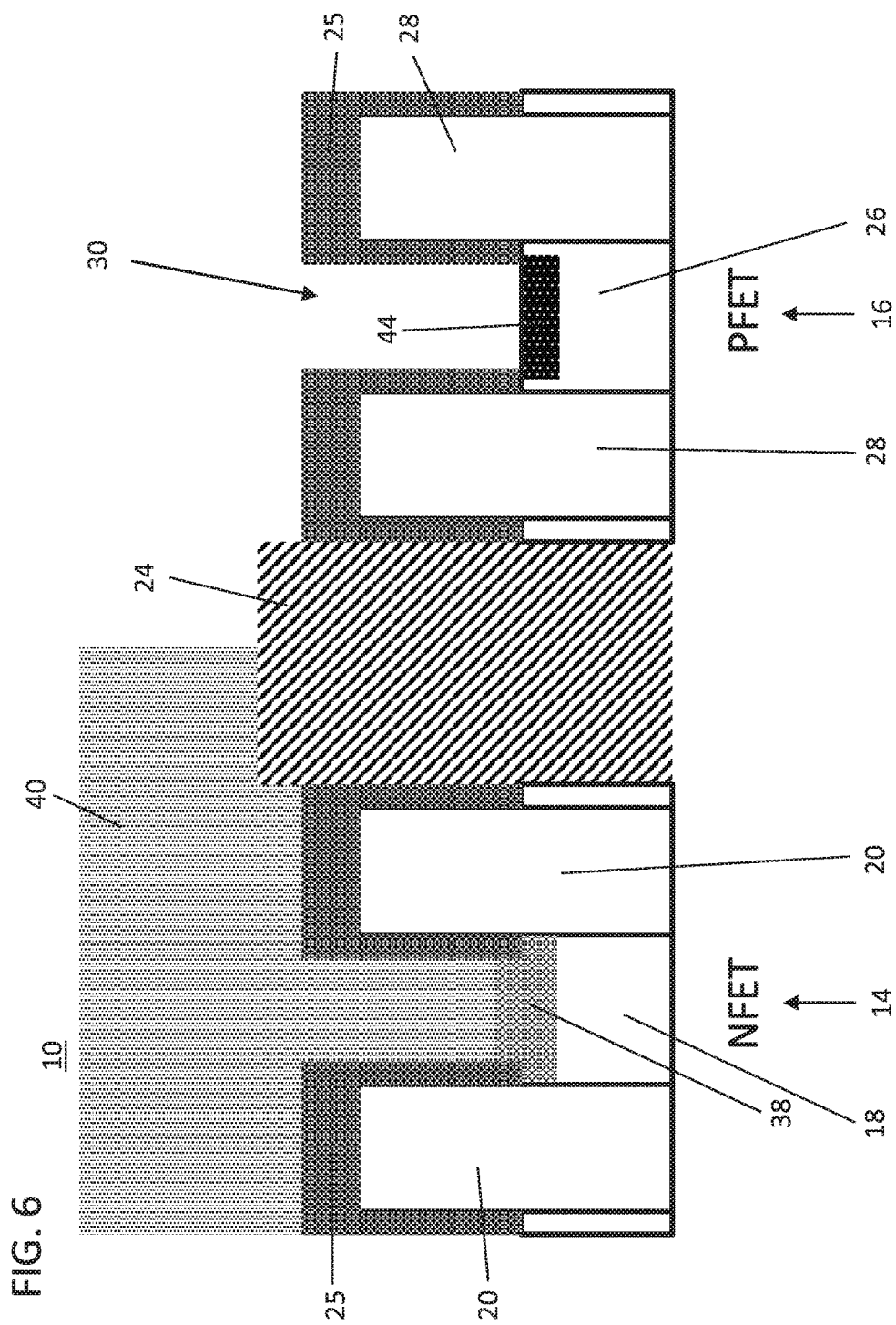
FIG. 6 is a cross-sectional view of the CMOS device of FIG. 5 having the NFET region blocked to form a dopant implanted region in the S/D region of the PFET region in accordance with one embodiment of the present invention.

Referring to FIG. 6, a block level lithography process can include forming a resist or other masking materials 40 over the NFET region 14 and in the trench 30 of the NFET region 14, and patterning the mask 40 to cover the NFET region 14, leaving the PFET region 16 and the trench 30 of the PFET region 16 exposed. The PFET source/drain region 26 is then implanted through the trench 30 over PFET region 16 with implant elements, such as gallium (Ga), aluminum (Al), Ga and Al, etc. to form a second highly doped and homogenized amorphous layer 44 in the source/drain region 26 of the PFET 16. The highly doped amorphous layer 44 includes amorphized silicon germanium (SiGe) when the source/drain region 26 includes SiGe. The Ge percentage in the SiGe can be below 70% and preferably from about 70% to about 30%, such as, e.g., $Si_{0.5}Ge_{0.5}$. The concentration of Ge in SiGe can be graded with lower concentration of Ge toward the bottom of source/drain regions 26 and higher Ge concentration toward the top portion of source/drain region 26 and within the amorphous layer 44.

The amorphous layer 44 can include amorphized SiGe:B:Ga, SiGe:B:Al, or SiGe:B:Al:Ga material or their combinations with concentration of gallium or aluminum exceeding their respective chemical solid solubility in silicon germanium. Chemical solid solubility of aluminum and gallium in silicon germanium depends on Ge content and is in between respective chemical solubility in pure silicon and pure germanium. The maximum chemical solubility of Al and Ga in pure silicon is 0.04 atomic % or $2\times10^{19}$ cm$^{-3}$, and 0.08 atomic % or $4\times10^{19}$ cm$^{-3}$, respectively. The maximum chemical solubility of both Al and Ga in pure germanium is about 1 atomic % or $5\times10^{20}$ cm$^{-3}$. Due to a higher chemical solubility in silicon, SiGe:B:Ga material is preferred over SiGe:B:Al for Ge content in SiGe of less than 60%. The preferred concentration of gallium or aluminum in layer 44 is from about 3 atomic % or $1.5\times10^{21}$ cm$^{-3}$ to about 20 atomic % or $1\times10^{22}$ cm$^{-3}$, far exceeding the maximum solubility limit. The dose of gallium or aluminum implants is selected to obtain the desired level and distribution of gallium or aluminum in layer 44. The energy of gallium or aluminum implant is selected to yield the desired depth or thickness of layer 44. The preferred depth of layer 44 is from about 5 nm to about 10 nm yielding the preferred implant energy range of from about 0.6 keV to about 3 keV for aluminum and from about 1 keV to about 5 keV for gallium. The preferred dose range is from about $1\times10^{15}$ cm$^{-2}$ to about $8\times10^{15}$ cm$^{-2}$.

Due to its larger atomic size, Ga does not straggle as much as aluminum or boron during the implantation process, leading to more packetized region 44 and preventing any ion scattering into the transistor channel under gate structure 28. Due to this reason, Ga implantation is preferable for a thicker layer 44. The implantation process can be conducted at room temperature or below room temperature (e.g., cold or cryogenic ion implantation) in a beamline or plasma doping implant equipment.

Figure 7:
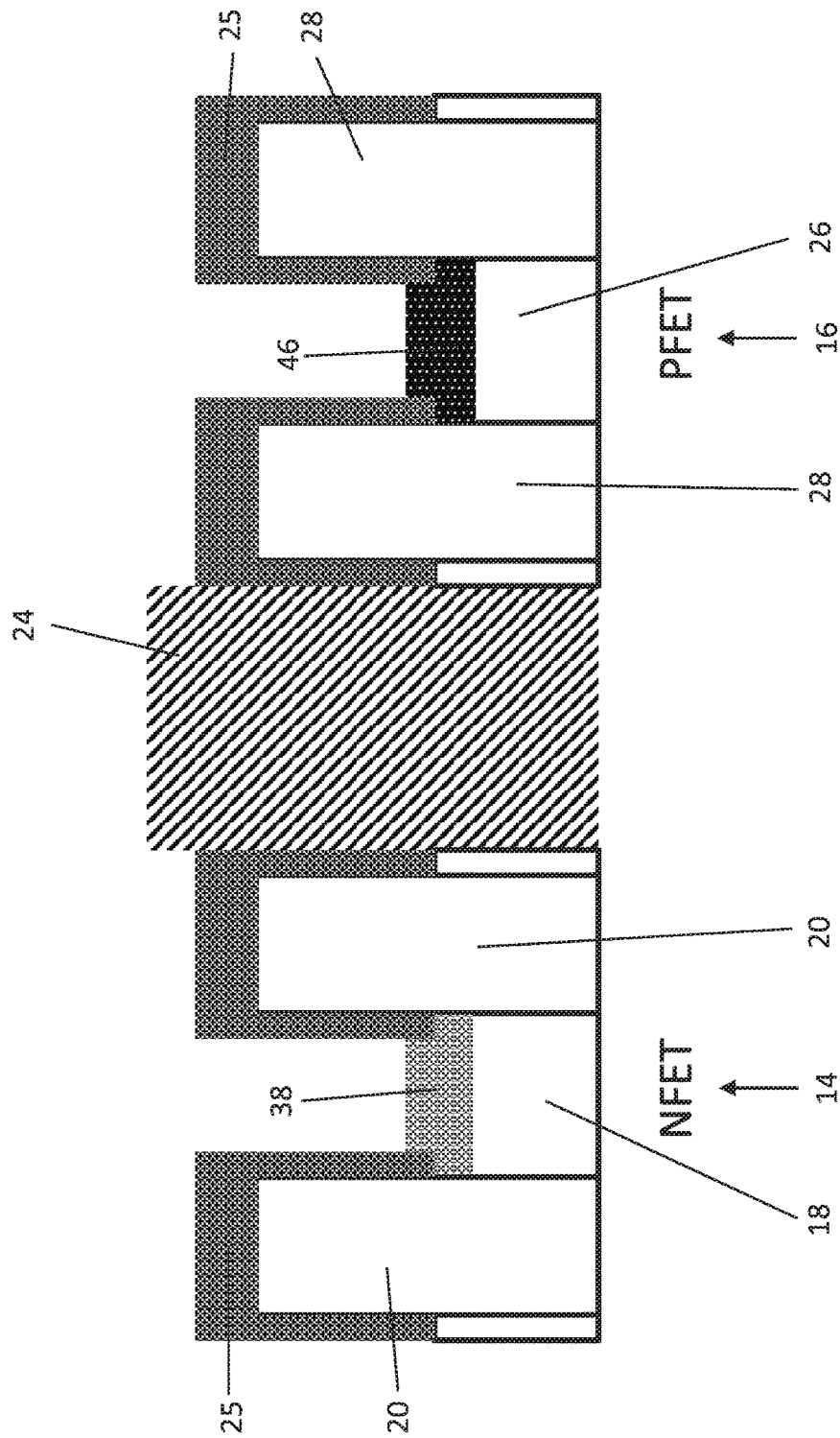
FIG. 7 is a cross-sectional view of the CMOS of FIG. 6 having a recrystallized alloy layer formed in the S/D regions of the PFET region in accordance with one embodiment of the present invention.

Referring to FIG. 7, the block mask 40 is removed and a solid phase epitaxy (SPE) or liquid phase epitaxy (LPE) is induced by a second fast anneal to provide a second metastable crystalline layer 46, which can include an alloy (e.g., a metastable alloy) such as SiGe:B:Ga or SiGe:B:Al, or SiGe:B:Ga:Al. The metastable crystalline layer 46 is an alloy layer (e.g., a metastable alloy layer) which includes a substantially higher homogeneous concentration of dopants than their respective solid solubility in silicon germanium. The metastable alloy layer 46 in the source/drain region 26 provides a lower source/drain contact resistance for the PFET contact while the rest of region 26 provides a lower sheet resistance. The SPE or LPE process alters the crystallinity of the second amorphous layer 44, or portions thereof, and the crystalline layer 46 exhibits crystalline phases (e.g., polycrystalline, nanocrystalline, single crystalline, etc.). The second fast anneal is performed at a second temperature and a second duration or, collectively, with a second thermal budget. In the case of SPE, the second fast annealing is a millisecond annealing with characteristic duration at ($T_p$–50 C.) of from about 50 microsecond to about 3 milliseconds. The range of a second annealing temperature suitable for inducing SPE in layer 44 is from about 600 degree Celsius to about 800 degree Celsius. The second annealing temperature is lower than the first annealing temperature at similar annealing duration such that the amorphous layer 44 is converted to a metastable alloy layer 46 without affecting the metastable alloy layer 38 of the NFET region 14 and the gate structures 20, 28. Selecting a lower second annealing temperature is possible due to a faster SPE speed in doped amorphous SiGe opposite to doped amorphous Si. For example, an anneal having a second temperature of approximately 800 degrees Celsius and duration of approximately 200 microseconds at 750 degree Celsius can transition the amorphous phase of the material of the second amorphous layer 44 to a recrystallized metastable alloy layer 46.

Alternatively, in the case of LPE, the second fast annealing can be a nanosecond laser melt annealing with characteristic duration of from about 20 nanoseconds to about 1000 nanoseconds at the melting point of amorphous material 44. The melting point of amorphous material 44 is about 200 degrees Celsius lower than the melting point $T_{m2}$ of crystalline material 26. The melting point of the amorphous SiGe material 44 depends on Ge content and is in between about 950 degree Celsius (70% Ge) and about 1150 degree Celsius (30% Ge). In addition, the presence of low-melting point gallium in large quantities in material 44 can further lower its melting point. Material 44 with lower melting point allows for a wider temperature process window for nanosecond laser melt annealing. The nanosecond laser melt annealing converts amorphous material 44 directly into its liquid phase that then quickly recrystallizes into a crystalline phase forming crystalline layer 46. The ultra-short duration of nanosecond laser melt annealing reduces negative effects on the metastable alloy layer 38 and the gate structures 20, 28. The ultra-fast speed of LPE process allows for creating highly metastable SiGe:B:Ga or SiGe:B:Al alloys and also leads to a graded Ge content within layer 46 due to a Ge segregation effect at the surface of layer 46. Higher Ge content at or near the surface of layer 46 can further reduce the contact resistance for PFET contact. Due to these reasons, the LPE re-growth induced by a nanosecond laser melt annealing is preferred at this step. It should be noted that other temperatures and durations or, collectively, thermal budgets for the first and second fast annealing steps can be employed, however such temperatures and durations or thermal budgets are dependent on the type of materials used in the NFET and PFET regions and their respective melting points and should be sufficient to provide recrystallization of the amorphous regions.

In useful embodiments, a first thermal budget can be employed for a first amorphous layer recrystallization fast anneal and a second thermal budget can be employed for a second amorphous layer recrystallization fast anneal, wherein the second thermal budget is less than the first thermal budget. The thermal budget considers time and temperature. If the first thermal budget includes 800 degrees Celsius for 200 msec, the second budget can include millisecond annealing at temperatures between about 600 degrees Celsius and about 800 degrees Celsius. In another example, the second thermal budget can include nanosecond laser melt annealing at a temperature between about 950 degrees Celsius and about 1150 degrees Celsius.

Metastable includes not allowing for segregation or precipitation of excess dopant content. The crystalline layer 46 can include a dopant concentration of more than about 2 atomic percent. In some embodiments, the metastable alloy layer 46 includes a p-type dopant concentration in a range between 2 and 20 atomic percent and germanium (Ge) being less than 70%, which is far more than a solubility limit of Ga in SiGe. For example, conventional techniques such as source/drain implantation or in-situ boron doping during gas phase epitaxial growth, for example, can result in dopant concentrations in SiGe less than 2 atomic percent without much precipitation or segregation of implant elements. In some embodiments, the germanium (Ge) present in the crystalline layer 46 is from about 30% to about 60%. It should be noted that the first metastable alloy of crystalline layer 38 is not affected by the second annealing process for forming the metastable alloy of crystalline layer 46, since the second annealing process has a lower thermal budget, e.g., lower second anneal temperature or substantially lower second anneal duration, than the first thermal budget of the first fast annealing used for the NFET region 14.

It should be understood that the order of metastable alloy layer formation can be reversed in some embodiments where the first and second thermal budgets are approximately the same, e.g., the block mask 32 may be patterned to cover the n-doped region to make p-type metastable alloy layer first and the process steps of FIGS. 5-7 can be reversed.

Figure 8:
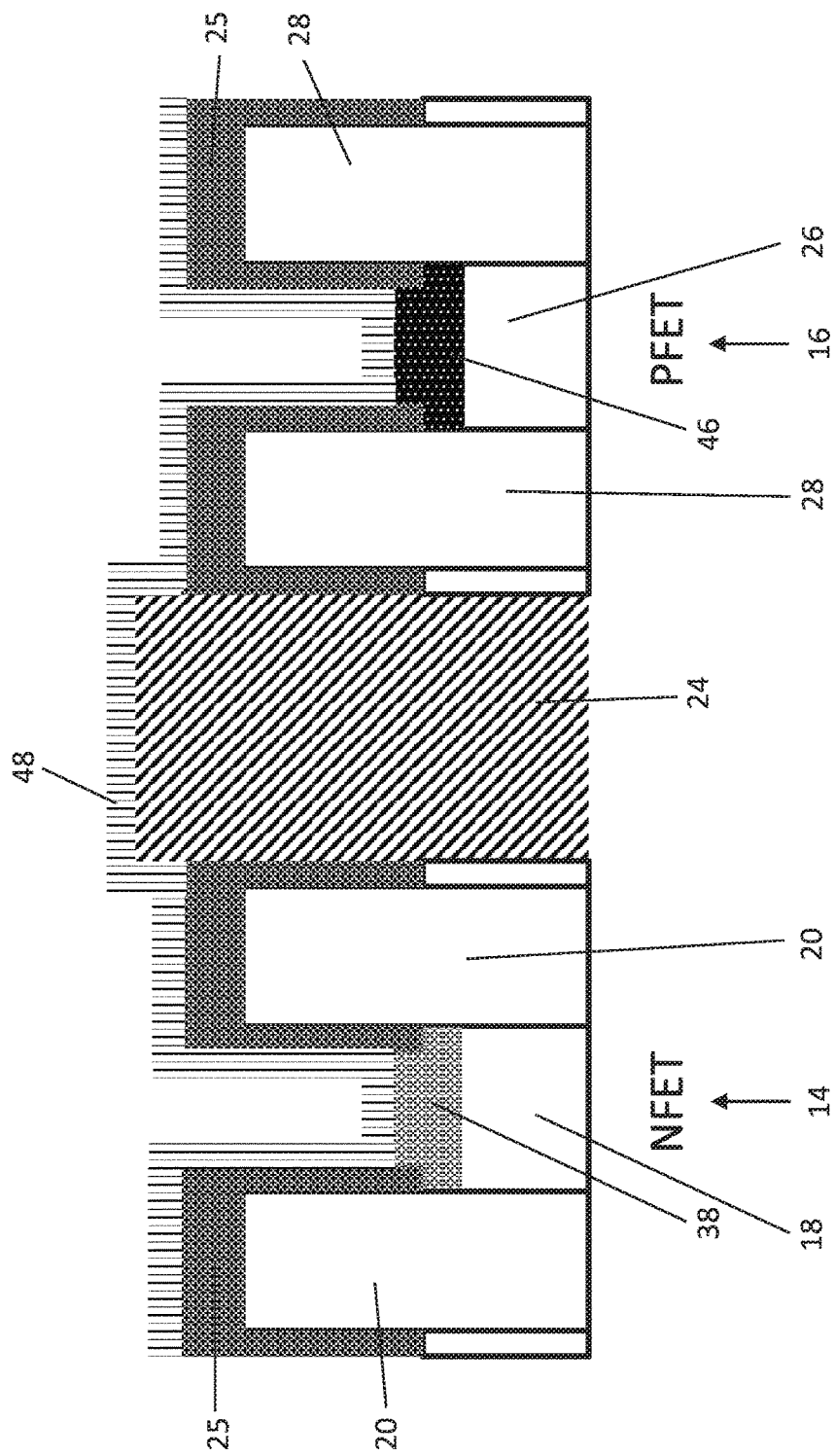
FIG. 8 is a cross-sectional view of the CMOS of FIG. 7 having contact liners formed to the source/drains in the NFET and PFET regions in accordance with one embodiment of the present invention.

Referring to FIG. 8, a metallic contact liner 48 can be formed conformally over crystalline regions 38 and 46 and along horizontal and/or vertical portions of the protection layer 25, the insulating material 24 and along sidewalls and/or horizontal portions of the trench 30. The contact liner 48 includes, for example, titanium (Ti), titanium nitride (TiN), or other similarly functioning materials. The metallic liner 48 can include multiple layers, e.g., liner 48 can include 2-4 nm of titanium (Ti) metal directly over crystalline regions 38 and 46 followed by 2-5 nm of titanium nitride metallic compound (TiN).

Figure 9:
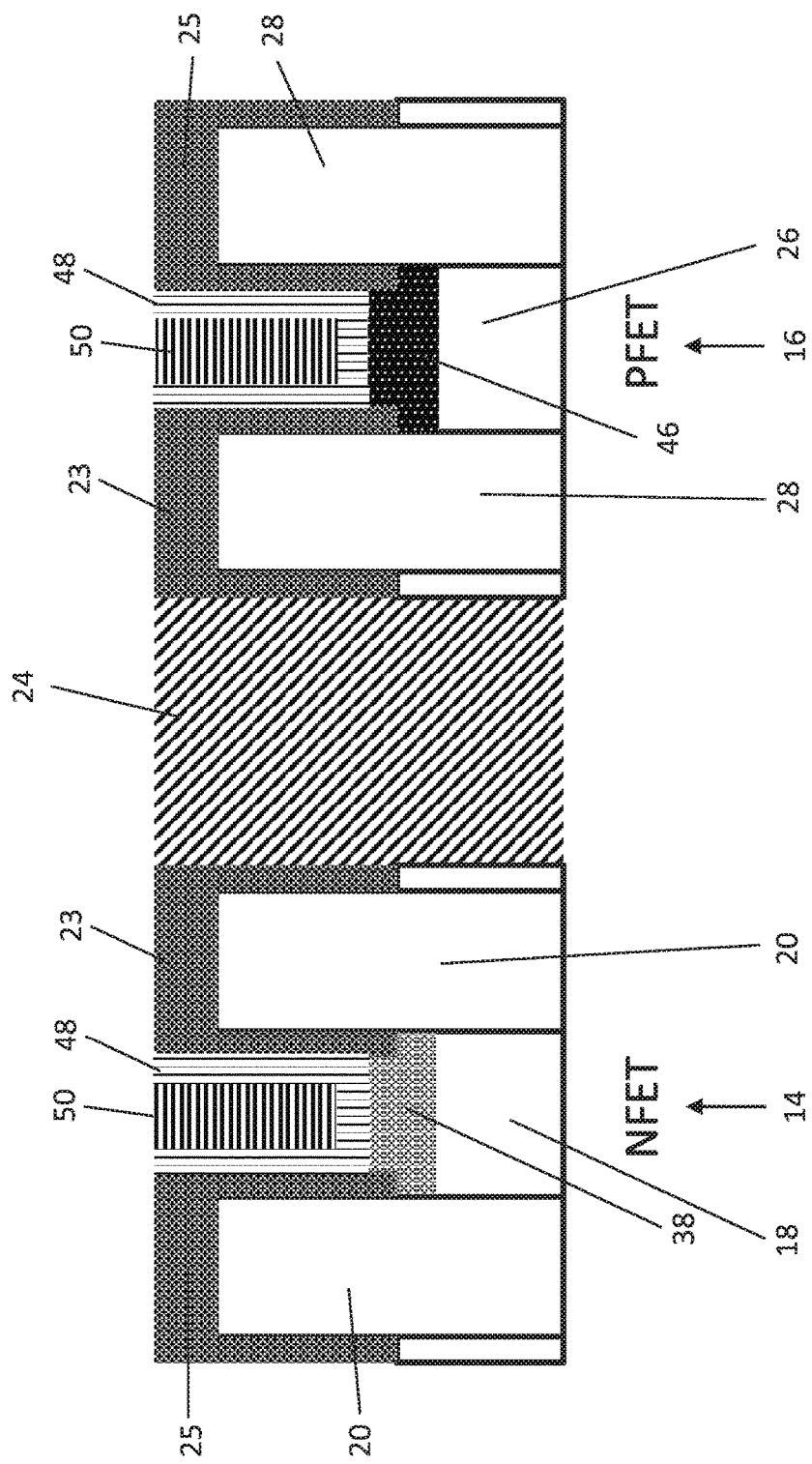
FIG. 9 is a cross-sectional view of the CMOS of FIG. 8 having metal contacts formed on the contact liners in the NFET and PFET regions in accordance with one embodiment of the present invention.

Referring to FIG. 9, a contact metal is deposited over the liner 48. Conductive contact metal 50 is deposited in the remaining portion of the trenches 30 in both the NFET and PFET regions 14, 16. In some embodiments, the metal 50 includes tungsten (W) or cobalt (Co); however, other highly conductive materials are readily contemplated. A planarization process, such as chemical mechanical planarization (CMP), can be subsequently employed to planarize and remove the overburden of metal 50, the contact liner 48, and a portion of insulating material 24 down to the protection layer 25. The CMP can stop on the cap 23 or the protection layer 25 to provide a planarized surface along the device 10, as illustrated in FIG. 9. In some embodiments, the contact liner 48 provides metal species (e.g., Ti) to form a silicide (e.g., TiSi, TiGe, etc.) for a S/D contact interface. The contact liner 28 protects the underlying layers from oxidation at the S/D contact interface. In other embodiments, however, the contact liner 48 can be omitted.

Formation of the silicide is optional and accomplished with the aid of an additional annealing that has a lower thermal budget than that of the second fast annealing employed in forming 46. This additional annealing can be conducted either after the planarization step or after forming the contact liner 48. The contact liner 48 forms a portion of the metal-semiconductor contact. It is an interface between the liner 48 and the crystalline regions 38, 46 that determines n-type and p-type contact resistances, respectively. A TiN contact liner 48 protects the underlying Ti layer from exposure to ambient air and chemical precursors employed in depositing metal 50.

Metal contacts 50 are formed in the remaining portion of the trenches 30 in both the NFET and PFET regions 14, 16. In some embodiments, the metal contact 50 includes tungsten (W), however other materials are readily contemplated. The source/drain regions 18, 26 include crystalline layers 38, 46, which may include metastable alloys, resulting in lower source/drain resistance for both the NFET and PFET contacts. In some embodiments, both metal-n-semiconductor and metal-p-semiconductor contacts can exhibit contact resistivity of approximately $2.5 \times 10^{-9}$ ohm·cm$^2$ or less in one or both the NFET region 14 and PFET region 16.

It should be understood that the present embodiments can be employed in different ways. In some embodiments, the implantation of the S/D regions can occur through the protection layers, and annealing the NFET and PFET regions can occur concurrently.

Figure 10:
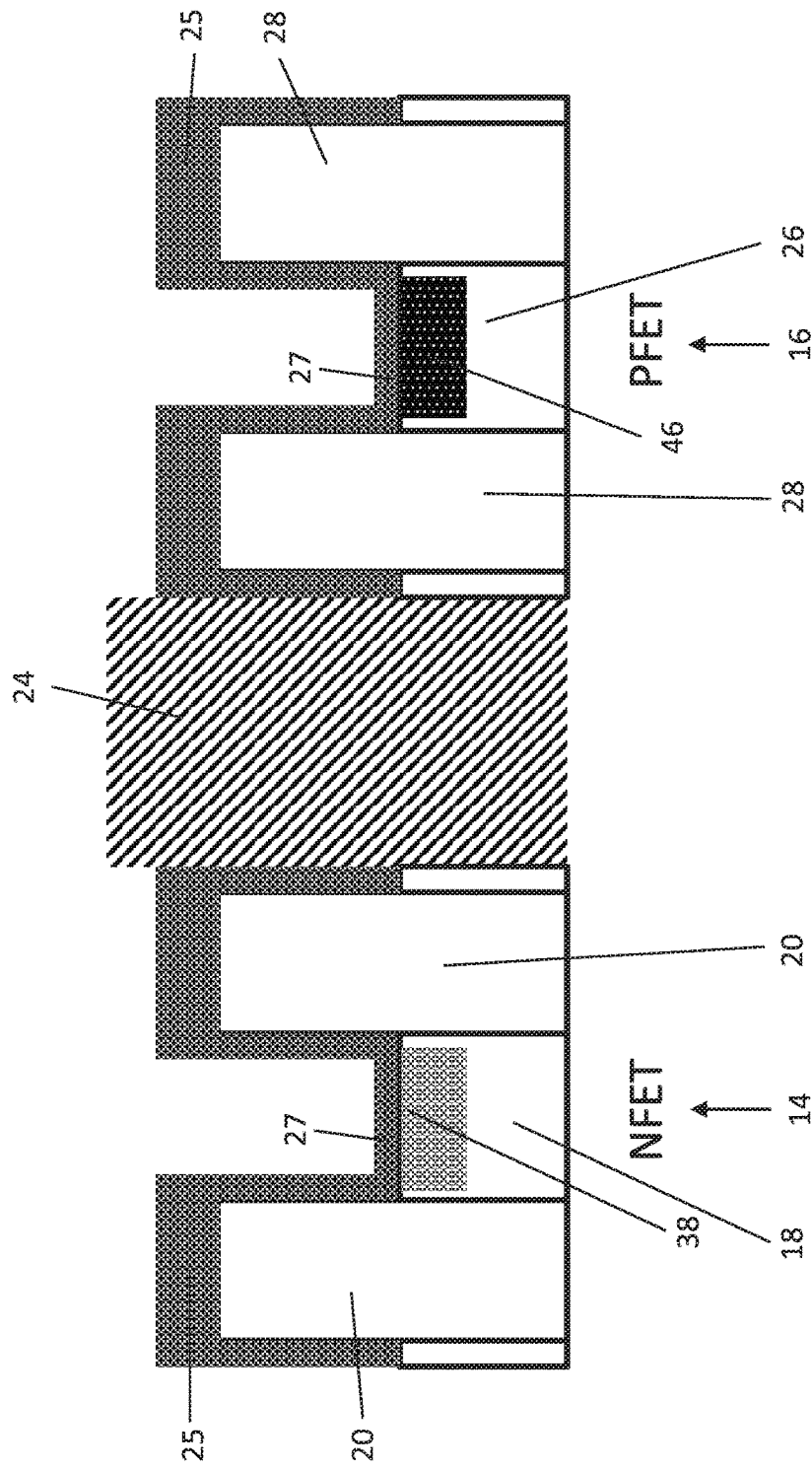
FIG. 10 is a cross-sectional view of a CMOS device showing implanted dopants through the protection layer and employing a single anneal process in the NFET and PFET regions in accordance with another embodiment of the present invention.

Referring to FIG. 10, in another embodiment, block masks can be employed to permit alternate doping of the S/D regions 18 and 26. The doping is performed through a horizontal portion 27 the protection layer 25. A solid phase epitaxy (SPE) anneal is performed to form regions 38 and 46 concurrently at a single temperature (e.g., approximately 800 degrees Celsius) to provide metastable crystalline layers 38, 46, which can include an alloy (e.g., a metastable alloy) as described above. Next, the portions 27 are removed together followed by a liner 48 and a contact metal 50 as described above.

Figure 11:
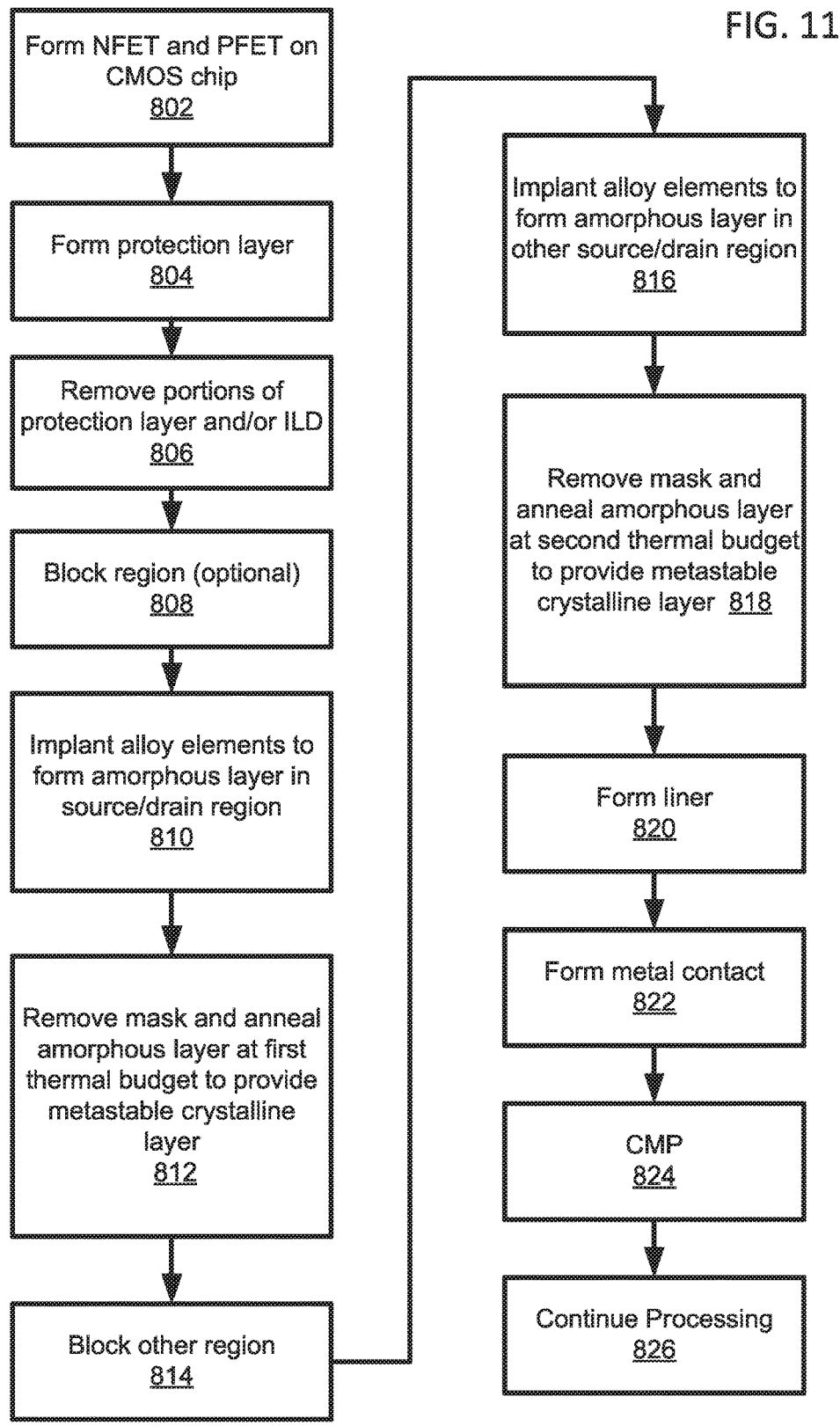
FIG. 11 is a block/flow diagram showing methods form forming semiconductor devices having low resistance contacts, in accordance with embodiments of the present invention.

Referring to FIG. 11, methods for forming semiconductor devices are provided in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 802, NFET region and a PFET region are formed on a CMOS chip (e.g., a same substrate). In some embodiments, a protection layer is formed over at least one of the NFET region and PFET region such that their respective structures are protected from subsequent processes, in block 804. In block 806, portions of the protection layer (if present) and/or an insulating layer, such as an ILD, can optionally be removed from source/drain (S/D) regions of the NFET and/or PFET regions to provide access to the S/D regions of the NFET and/or PFET.

In block 808, a block or mask is formed to cover the PFET (or NFET) region, and in block 810 the NFET (or PFET) region is exposed to ion implantation of alloy elements or implant elements to form an amorphous layer in a top portion of the S/D region. In block 812, the mask over the PFET (or NFET) region can be removed and the CMOS chip is subjected to a first annealing such that the amorphous layer recrystallizes to provide a crystalline metastable alloy layer in the S/D region. In particularly useful embodiments, the implant element concentration in the S/D matrix material exceeds the solubility of the S/D matrix material.

In block 814, a block or mask may be formed to cover the NFET (or PFET) region. The block mask is optional if neutral species are employed in the formation of the amorphous layer in the first S/D region. In block 816, the other region, e.g., PFET (or NFET), is exposed to ion implantation of implant elements to form an amorphous layer in a top portion of the source/drain region of the PFET. In particularly useful embodiments, the implant element concentration in the S/D matrix material exceeds the solubility of the S/D matrix material.

In block 818, the mask over the NFET (or PFET) region can be removed and the CMOS chip is subjected to a second annealing such that the amorphous layer in the PFET (or NFET) region recrystallizes to provide a crystalline metastable alloyed layer in the source/drain of the PFET region. The thermal budget (temperature and/or duration) of second annealing is lower than the thermal budget (temperature and/or duration) of first annealing such that the second annealing does not affect the metastable alloy of the NFET region.

In one embodiment, annealing the first and second elements in first and second anneal processes includes a first anneal at a first thermal budget and a second anneal at a second thermal budget that is lower than the first thermal budget. Thermal budget includes total thermal energy and considers duration and temperature magnitudes.

It should be noted, however, that blocks 814-818 and blocks 808-812 can be reversed such that the PFET region is processed first at a first anneal temperature while the NFET region is processes subsequently at a second anneal temperature, provided that whichever region is processed later is subjected to a temperature which does not affect the first metastable layer if the first and second annealing thermal budgets are similar.

In one embodiment, the first and second temperatures and durations can be similar (e.g., the same temperature and duration). In other embodiments, the first thermal budget is higher than the second thermal budget, thus preserving the first metastable alloy during formation of the second metastable alloy. In another embodiment, the first annealing process is a millisecond annealing while the second annealing process is a nanosecond laser melt annealing.

In block 820, a metallic liner (e.g., a conformal metallic layer, preferably common to both PFET and NFET regions) can be formed over the metastable alloy layers and over the insulating material along sidewalls and bottom portions of the trench in contact with the S/D regions in both the NFET and PFET regions. The liner can include Ti, TiN, Ta, TaN or any other suitable material. In block 822, a conductive metal contact is deposited on the liner (if present) in the remaining portion of the trenches in both the NFET and PFET regions 14, 16. The conductive metal contact 50 can include, for example, tungsten (W) or any other suitable conductive material, e.g., cobalt (Co). Due to the crystalline metastable alloy layers formed as an interface between contacts and the S/D regions of the NFET and PFET, both the NFET and PFET contacts have lower contact resistances. In some embodiments, the contact resistivity is approximately $2.5 \times 10^{-9}$ ohm·cm$^2$ or less in one or both the NFET and PFET regions. A planarization process (e.g., CMP) can be employed to planarize the protection layer, remove the overburden metal, metallic contact liner, and portions of insulating material, in block 824.

In block 826, processing continues to complete the CMOS device, such as forming contacts to the gate structures, forming additional metal lines and layers, etc. (e.g., opening gate contact regions using a gate contact opening mask, opening gate contacts on both NFET gate 20 and PFET gate 28 using a RIE (dry etch), removing the gate contact mask, depositing gate contact metals (e.g., Ti, TiN, W, Co), and performing CMP to a top surface of the protection layer 25, etc.).

Having described preferred embodiments of a device and method for forming low resistance source/drain contacts for CMOS devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
    source/drain regions (S/D) in an n-type field effect transistor (NFET) region and in a p-type field effect transistor (PFET) region;
    contacts formed to recrystallized layers of the S/D regions in the NFET and PFET regions; and
    metastable recrystallized interface layers formed between the contacts and the S/D regions in respective NFET and PFET regions, the recrystallized interface layers including an alloy element concentration that exceeds solubility with a respective material of the S/D regions in the respective NFET and PFET regions.

2. The device as recited in claim 1, wherein the metastable recrystallized interface layers include a contact resistivity of about $2.5 \times 10^{-9}$ ohm-cm$^2$ or less in at least one of the NFET region and the PFET region.

3. The device as recited in claim 1, wherein the metastable recrystallized layer of the NFET region includes an alloy element concentration that exceeds 5 atomic percent and the metastable recrystallized layer of the PFET region includes an alloy element concentration that exceeds 3 atomic percent.

4. The device as recited in claim 1, wherein the metastable recrystallized layer of the NFET region includes an alloy element concentration that exceeds 5 atomic percent.

5. The device as recited in claim 1, wherein the metastable recrystallized layer of the NFET region includes phosphorous in silicon having an alloy element concentration between about 5 to about 15 atomic percent.

6. The device as recited in claim 1, wherein the metastable recrystallized layer of the PFET region includes an alloy element concentration that exceeds 3 atomic percent.

7. The device as recited in claim 1, wherein the metastable recrystallized layer of the PFET region includes gallium and/or aluminum in silicon germanium having an alloy element concentration between about 3 to about 20 atomic percent.

8. The device as recited in claim 1, wherein the S/D region in the PFET region includes silicon germanium having a Ge concentration greater than 30% and less than 60%.

9. A semiconductor device, comprising:
   contacts formed to recrystallized layers of source/drain regions (S/D) in an n-type field effect transistor (NFET) region and in a p-type field effect transistor (PFET) region, wherein the SID region in the PFET region includes silicon germanium having a Ge concentration less than 70%; and
   metastable recrystallized interface layers formed between the contacts and the S/D regions in respective NFET and PFET regions, the recrystallized interface layers including an alloy element concentration that exceeds solubility with a respective material of the S/D regions in the respective NFET and PFET regions.

10. The device as recited in claim 9, wherein the metastable recrystallized interface layers include a contact resistivity of about $2.5 \times 10^{-9}$ ohm-cm$^2$ or less in at least one of the NFET region and the PFET region.

11. The device as recited in claim 9, wherein the metastable recrystallized layer of the NFET region includes an alloy element concentration that exceeds 5 atomic percent and the metastable recrystallized layer of the PFET region includes an alloy element concentration that exceeds 3 atomic percent.

12. The device as recited in claim 9, wherein the metastable recrystallized layer of the NFET region includes an alloy element concentration that exceeds 5 atomic percent.

13. The device as recited in claim 9, wherein the metastable recrystallized layer of the NFET region includes phosphorous in silicon having an alloy element concentration between about 5 to about 15 atomic percent.

14. The device as recited in claim 9, wherein the metastable recrystallized layer of the PFET region includes an alloy element concentration that exceeds 3 atomic percent.

15. The device as recited in claim 9, wherein the metastable recrystallized layer of the PFET region includes gallium and/or aluminum in silicon germanium having an alloy element concentration between about 3 to about 20 atomic percent.

16. The device as recited in claim 9, wherein the S/D region in the PFET region includes silicon germanium having a Ge concentration greater than 30% and less than 70%.

* * * * *